United States Patent [19]

Tipon

[11] Patent Number: 5,585,740
[45] Date of Patent: Dec. 17, 1996

[54] CMOS LOW OUTPUT VOLTAGE BUS DRIVER WITH CONTROLLED CLAMPS

[75] Inventor: Donald G. Tipon, San Diego, Calif.

[73] Assignee: NCR Corporation, Dayton, Ohio

[21] Appl. No.: 597,475

[22] Filed: Feb. 2, 1996

Related U.S. Application Data

[63] Continuation of Ser. No. 164,975, Dec. 10, 1993, abandoned.

[51] Int. Cl.$^6$ .......................... G06F 13/00; H03K 19/00
[52] U.S. Cl. ........................ 326/26; 326/30; 326/86; 326/121
[58] Field of Search ................... 326/26, 30, 86, 326/121

[56] References Cited

U.S. PATENT DOCUMENTS

| | | | |
|---|---|---|---|
| 5,134,316 | 7/1992 | Ta | 307/475 |
| 5,248,906 | 9/1993 | Mahmood | 307/443 |
| 5,313,118 | 5/1994 | Lundberg | 307/451 |
| 5,384,498 | 1/1995 | Wong | 326/31 |

*Primary Examiner*—Ayaz R. Sheikh
*Assistant Examiner*—John Travis
*Attorney, Agent, or Firm*—James M. Stover

[57] ABSTRACT

In a high speed digital computer data transfer system, a data bus driver, implemented using complementary metal-oxide-semiconductor (CMOS), reduces data bus voltage swings between logic high and logic low levels by defining minimum and maximum bus voltages which lie between said logic levels, thus lowering bus transition and hence data transfer times. Voltage overshoot and undershoot of the reduced bus logic levels are prevented by two "clamping diode" transistors. One of the two clamping diodes connected to the data bus is biased to a point just below conductivity, while the second clamping diode is biased to a point just below conductivity. As a result, if the output voltage rises above a selected level, the first clamping transistor acts as a conducting diode to pull the output voltage down, and, in a similar manner, if the output voltage at node falls below a selected level, then the second clamping transistor functions as a conducting diode to pull the output voltage up to an acceptable level.

8 Claims, 3 Drawing Sheets

5,585,740

CMOS LOW OUTPUT VOLTAGE BUS DRIVER WITH CONTROLLED CLAMPS

This is a continuation of application Ser. No. 08/164,975, filed on Dec. 10, 1993, now abandoned.

The present invention relates to computer data transfer systems, and more particularly to means for increasing the data transfer speed of data buses suitable for use in microprocessor chips.

BACKGROUND OF THE INVENTION

Prior art data transfer systems, such as the system 100 shown in FIG. 1, often contain a precharging transistor 102 coupled to a data bus 104 for precharging the bus to a logic high level, e.g., 5 volts. This approach normally assumes that it is faster to pull the bus voltage down to a logic low level, e.g., 0 volts, from the logic high level, than the reverse. Pull-down transistors 106, 110 and 114 connected to bus logic blocks 108, 112 and 116, respectively, are operated to pull the bus voltage down to the logic low level by creating conduction paths to ground when activated.

Data bus 104 is maintained at a logic high voltage, which voltage is nearly instantaneously available at an input of an inverter 118. The data bus is pulled down when a logic low voltage is to be provided to the inverter. Precharging can thus increase the operating speed of data transfer systems.

However, repeated precharging cycles without the intervention of a pull-down operation can raise the precharge voltage to such a high level that the overall advantage of precharging is lost since the time for going from the logic high voltage to the logic low voltage is directly proportional to the precharge voltage. Even where there is not repeated precharging, the bus transition time for changing from the logic high voltage level to the logic low voltage level, and vice versa, may still be undesirably large for some high speed applications.

A bus driver circuit providing increased data transfer speed is presented in U.S. Pat. No. 5,179,299, titled "CMOS Low Output Voltage Bus Driver", which issued to Donald G. Tipon on Jan. 12, 1993, and is assigned to NCR Corporation of Dayton, Ohio. U.S. Pat. No. 5,179,299, which is expressly incorporated by reference, discloses for use in a high speed digital computer data transfer system, a complementary metal oxide semiconductor (CMOS) implemented data bus driver which reduces data bus voltage swings between logic high and logic low levels by defining minimum and maximum bus voltages which lie between said logic levels, thus lowering bus transition and hence data transfer times. Positive and negative overshoot of the reduced bus logic levels are prevented by "clamping diode" transistors. The data bus driver assumes a tri-state mode when not transmitting data, during which the clamping diode transistors also eliminate positive and negative bus voltage overshoot.

The circuit described in the incorporated reference provides superior operation over previous bus driver circuits. However, applicant has identified several features of the identified circuit which present an opportunity for enhanced performance. First, the conduction thresholds of the output transistors in CMOS bus driver circuits, such as the circuit shown in the incorporated reference, are influenced by variations in process, temperature and voltage, thus changing the clamping voltages, which may result in undesirable DC currents between bus drivers and clamping output drivers. Second, as a result of biasing the gate of the overshoot clamping transistor with the output node voltage, the driver load capacitance may be higher than desirable. And third, bus pull-up times may be slower than desirable since the CMOS N-channel output pull-up transistor has insufficient gate voltage, as CMOS processes tend to migrate to lower power supply voltages.

OBJECTS OF THE INVENTION

It is therefore an object of the present invention to provide a new and useful high speed data transfer system not subject to the above disadvantages.

It is another object of the present invention to provide a new and useful high speed data transfer system implemented in CMOS technology which eliminates undesirable DC bus currents.

It is also an object of the present invention to provide a new and useful high speed data transfer system implemented in CMOS technology which provides reduced bus driver load capacitance.

It is a further object of the present invention to provide a new and useful high speed data transfer system implemented in CMOS technology which provides decreased bus pull-up times.

It is yet another object of the present invention to provide a new and useful voltage clamping circuitry for a high speed data transfer system implemented in CMOS which is not influenced by variations in process, temperature and source voltages.

SUMMARY OF THE INVENTION

There is provided, in accordance with the present invention, a high speed digital computer data transfer system for transferring data in the form of logic level signals. The data transfer system includes an output node which connects to a data transfer bus for transferring the logic level signals. First and second ouput drivers are connected to the output node bus for driving the data transfer bus. A first clamping diode transistor is connected to the output node of the bus and connected at its gate to the first driver which activates to pull the voltage at the output node up to a first voltage level, representing a first logic level, when the voltage at the output node falls below the first voltage level. A second clamping diode transistor is similarly connected to the output node of the bus and connected at its gate to the second driver which activates to pull the voltage at the output node down to a second voltage level, representing a second logic level, when the voltage at the output node rises above the second voltage level. The first and second drivers pass first and second reference voltages to the first and second clamping diode transistors, the voltages being chosen to place the first and second clamping diode transistors in near-conduction states.

The details of the present invention will be revealed in the following description with reference to the drawings. The above and other objects, features, and advantages of the present invention will become apparent from the following description and the attached drawings.

DETAILED DESCRIPTION OF THE PREFERRED EMBODIMENT

Figure 1:
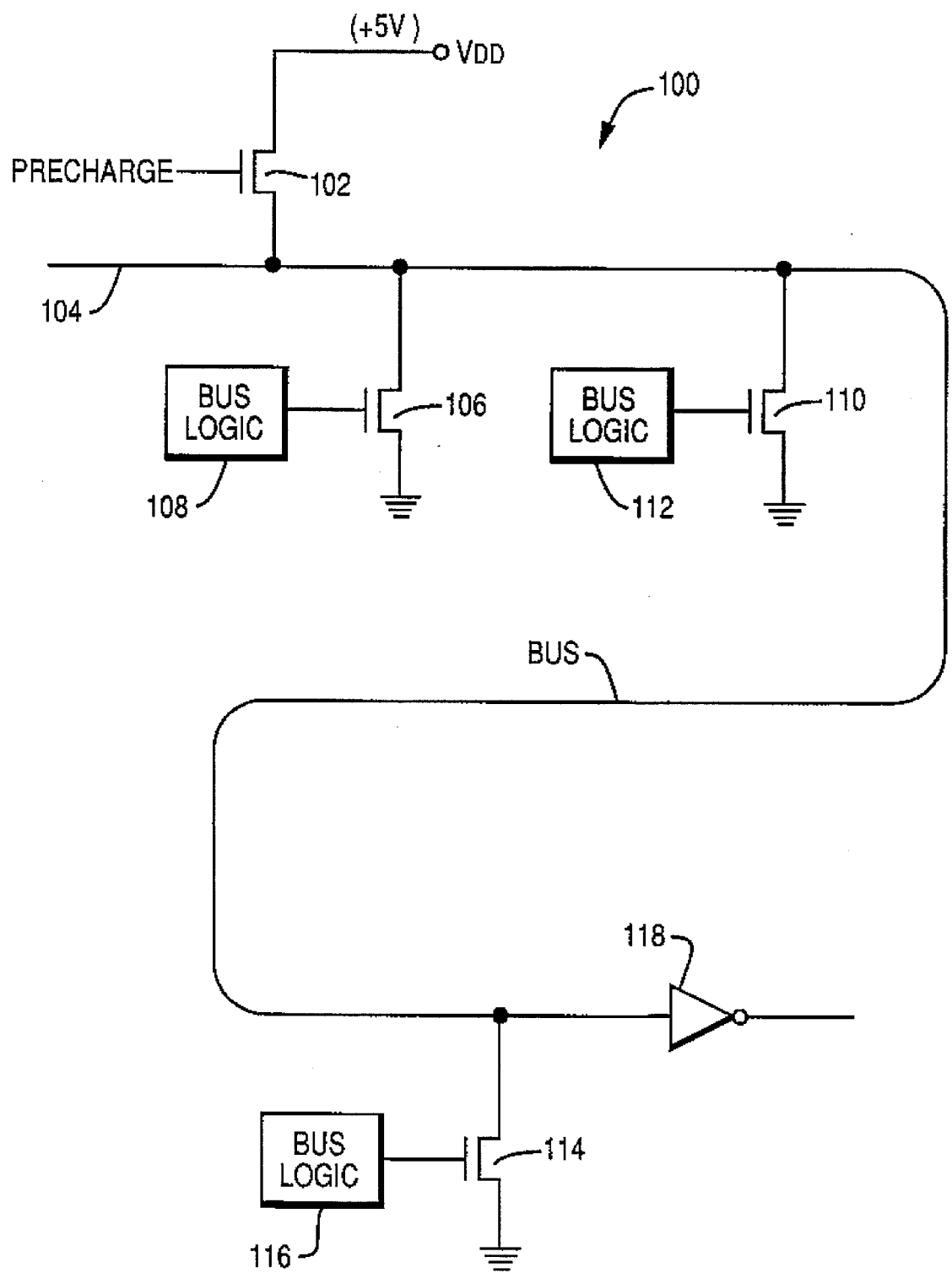
FIG. 1 is a generalized schematic diagram of a prior art data transfer system.
Figure 2:
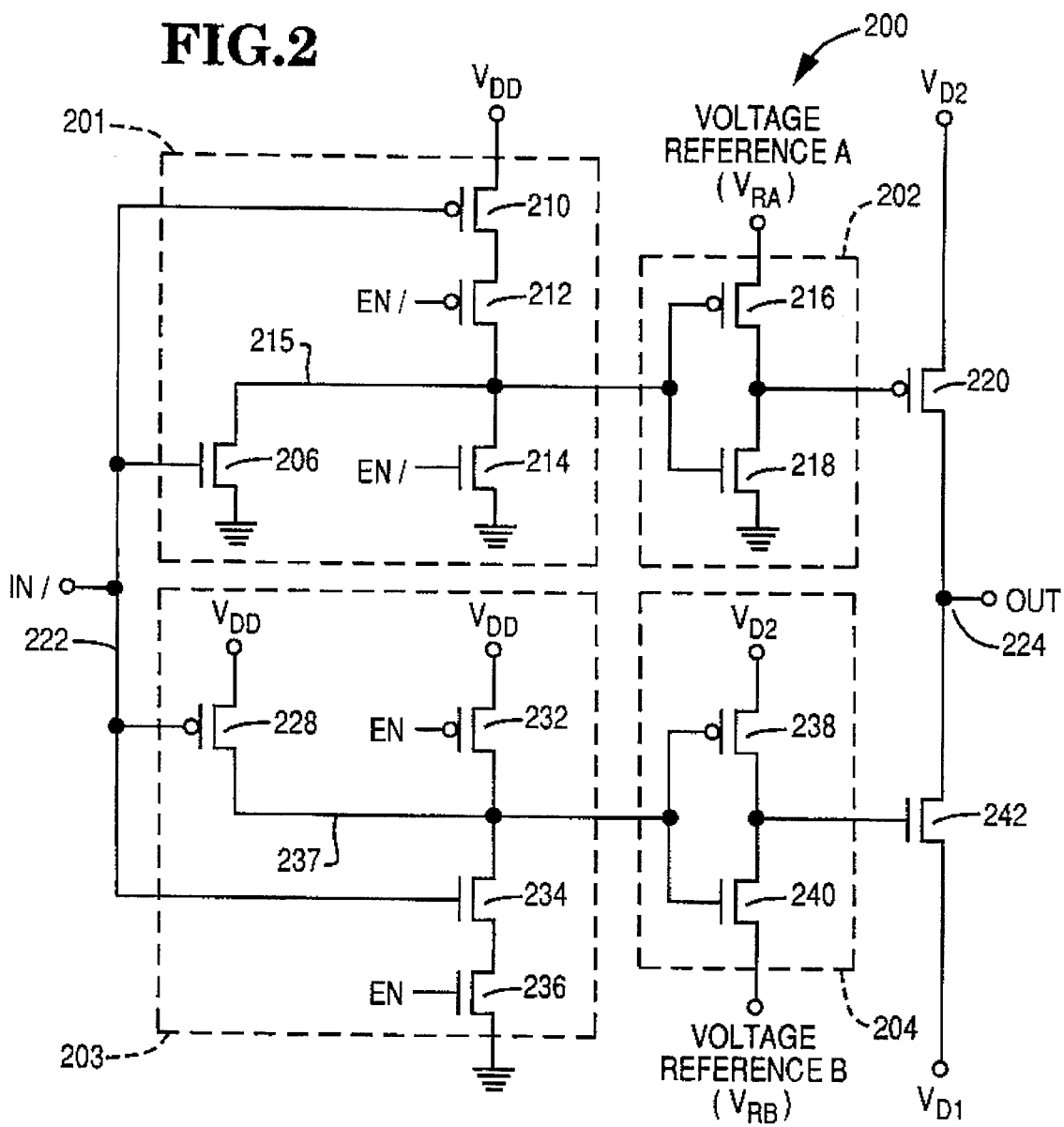
FIG. 2 is a detailed schematic diagram of the preferred embodiment of the present inventive data transfer system/ bus driver.

FIG. 2 shows the preferred embodiment for a high speed computer data bus driver 200 implemented using CMOS technology for transferring data signals IN/ received via a data input line 222 in the form of logic high and logic low voltages. The signal IN/ in the figure represents complemented data signals. Bus driver 200 is connected by its output node 224 to a data transfer bus, not shown, via an input buffer, also not shown, the details of the data transfer bus and input buffer are not described herein since they are not part of the present invention. All transistors are of the junction field-effect type (JFET), with a bubble at the gate indicating a p-channel JFET device, and the absence of a bubble at the gate indicating an n-channel JFET device.

The data bus driver 200 has five major components listed as follows: a NOR gate 201 formed by transistors 206, 210, 212 and 214; an inverter 202 formed by transistors 216 and 218; a pull-up/diode transistor 220; a NAND gate 203 formed by transistors 228, 232, 234 and 236; an inverter 204 formed by transistors 238 and 240; and a pull-down/diode transistor 242. The data bus driver 200 will now be described in connection with data transfer operations.

NOR gate 201 includes n-channel transistors 206 and 214 connected in parallel between the NOR gate's output, identified by reference numeral 215, and ground (0 volts). P-channel transistors 210 and 212 are connected in series between high voltage source $V_{DD}$ and NOR gate output 215. The gates of transistors 206 and 210 are connected to receive complemented input signal IN/ and the gates of transistors 214 and 212 are connected to receive complemented enable signal EN/. Each n-channel transistor is placed into a conducting state upon the application of a high logic level at its gate terminal and placed into a non-conducting state upon the application of a low logic level at its gate terminal. Conversely, each p-channel transistor is placed into a conducting state upon the application of a low logic level at its gate terminal and placed into a non-conducting state upon the application of a high logic level at its gate terminal. Thus, if either of signals IN/ or EN/ is high, NOR gate output 215 will be electrically connected through one or both of transistors 206 and 214 to ground, and electrically disconnected from $V_{DD}$ by the operation of one or both of transistors 210 and 212. The output of NOR gate 201 will be high, equal to $V_{DD}$, only when both IN/ and EN/ are low.

Inverter 202 includes p-channel transistor 216 and n-channel transistor 218 connected in series between a voltage source identified as Voltage Reference A ($V_{RA}$) and ground. The gate terminals of transistors 216 and 218 are connected to NOR gate output 215. The output of inverter 202 is connected to the gate terminal of pull-up/diode transistor 220. Thus when a low level output is received from NOR gate 201, transistor 216 is placed in a conducting state to provide voltage $V_{RA}$ to the gate of transistor 220. When a high level output is received from NOR gate 201, transistor 218 is placed in a conducting state to connect the gate of transistor 220 to ground potential.

NAND gate 203 includes p-channel transistors 228 and 232 connected in parallel between the NAND gate's output, identified by reference numeral 237, and high voltage source $V_{DD}$. N-channel transistors 234 and 236 are connected in series between NAND gate output 237 and ground. The gates of transistors 228 and 234 are connected to receive complemented input signal IN/ and the gates of transistors 232 and 236 are connected to receive enable signal EN. Thus, if either of signals IN/ or EN is low, NAND gate output 237 will be electrically connected through one or both of transistors 228 and 232 to voltage source $V_{DD}$, and electrically disconnected from the ground source by the operation of one or both of transistors 234 and 236. The output of NAND gate 203 will be low only when both IN/ and EN are high.

Inverter 204 includes p-channel transistor 238 and n-channel transistor 240 connected in series between a high voltage source $V_{D2}$ and a low voltage source identified as Voltage Reference B ($V_{RB}$). The gate terminals of transistors 238 and 240 are connected to NAND gate output 237. The output of inverter 204 is connected to the gate terminal of pull-down/diode transistor 242. Thus when a low level output is received from NAND gate 203, transistor 238 is placed in a conducting state to provide voltage $V_{D2}$ to the gate of transistor 242. When a high level output is received from NAND gate 203, transistor 240 is placed in a conducting state to connect the gate of transistor 242 to Voltage Reference B ($V_{RB}$)

The data bus driver 200 is disabled, i.e. placed into a high impedance state which disallows it to transfer data, by setting the enable signal EN and its complement EN/ to 0 volts and $V_{DD}$ volts, respectively. Since EN/ is set high, i.e., equal to $V_{DD}$ volts, the output of NOR gate 201 is 0. Thus, the output of the inverter 202 formed by the transistor pair 216 and 218 and hence the gate voltage provided to output transistor 220 equals the Voltage Reference A ($V_{RA}$).

Voltage Reference A ($V_{RA}$) is chosen to satisfy equation 1:

$$V_{RA}=V_{D2}-V_{TH220}+100 \text{ millivolts} \qquad \text{EQN1}$$

where $V_{D2}$ is the power supply voltage connected to the drain of the output transistor 220, and $V_{TH220}$ is the threshold voltage of the output transistor 220.

$V_{RA}$ biases the output transistor 220 to a point just below conductivity.

Also, while the bus driver 200 is disabled, the Reference Voltage B ($V_{RB}$) will appear at the gate of the output transistor 242, much in the same manner as $V_{RA}$ appears at the gate of the output transistor 220, except that the previously mentioned NAND gate 203 and inverter 204 in the bottom half of the circuit in FIG. 2 are involved instead of the NOR gate 201 and inverter 202 in the top half of the circuit. Since EN is set to 0 volts, the output of NAND gate 203 is equal to $V_{DD}$ volts. Accordingly, the output of the inverter 204 formed by the transistor pair 238 and 240 equals the Voltage Reference B ($V_{RB}$).

$V_{RB}$ and hence the gate voltage of output transistor 242 is defined by the following equation:

$$V_{RB}=V_{D1}+V_{TH242}-100 \text{ millivolts} \qquad \text{EQN2}$$

where $V_{D1}$ is the power supply voltage connected to the drain of the output transistor 242, and $V_{TH242}$ is the threshold voltage of the output transistor 242.

$V_{RB}$ biases the output transistor 242 to a point just below conductivity.

Figure 3:
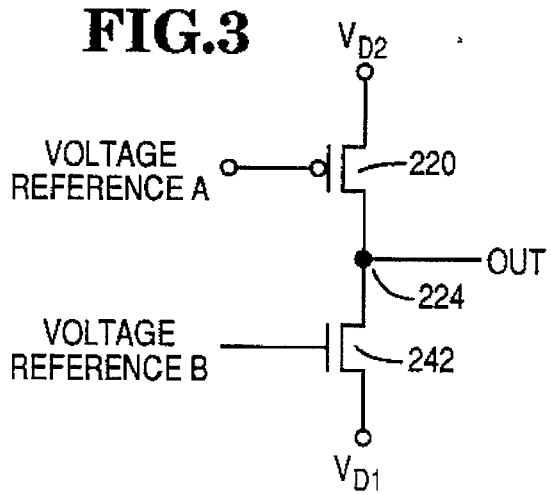
FIG. 3 is an electrical equivalent of the schematic diagram in FIG. 2 when the bus driver is in the disabled, or high impedance, mode.

When the bus driver 200 is in the disabled mode, i.e., EN is set to 0 volts, it behaves like the circuit in FIG. 3, the circuit in that Figure being used here only for pedagogical reasons. As stated earlier, $V_{RA}$ biases the output transistor 220 to a point just below conductivity and $V_{RB}$ biases the output transistor 242 to a point just below conductivity. As a result, if the output voltage at node 224 rises above, i.e., becomes more positive than, $V_{D2}$+100 millivolts, a condition referred to as voltage overshoot, then output transistor 220 acts as a conducting diode from the output node 224 to the power supply voltage $V_{D2}$ to pull the output voltage down to $V_{D2}$+100 millivolts. In a similar manner, if the output voltage at node 224 falls below, i.e., becomes more negative than, $V_{D1}$−100 millivolts, a condition identified as voltage undershoot, then output transistor 242 functions as a conducting diode from the output node 224 to the power supply voltage $V_{D1}$ to pull the output voltage up to $V_{D1}$−100 millivolts.

Figure 4:
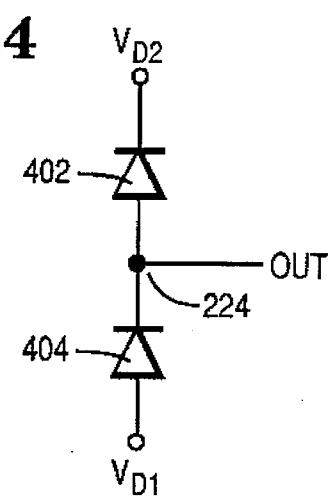
FIG. 4 is also an electrical equivalent of the schematic diagram in FIG. 2 when the bus driver is in the disabled mode, showing the output transistors in FIG. 3 as clamping diodes.

During either voltage overshoot or undershoot, an equivalent of the circuit 200 is as shown in FIG. 4, where the transistors 220 and 242 are shown as diodes 402 and 404, respectively.

The Voltage References A and B can track the threshold voltages of the transistors 220 and 242, respectively, which may vary from chip to chip, for example, because of temperature differences. Without this ability to correctly track the threshold voltages, clamped voltages may not be at their proper levels. Additionally, voltage sources $V_{RA}$ and $V_{RB}$ are low current sources, thus significantly reducing the power dissipation that would be associated with a circuit such as the aforementioned U.S. Pat. No. 5,179,299, in which the gates of the output transistors are tied to their drains and a miss-match of clamping voltages can cause significant current flow.

When the bus driver 200 is enabled to transfer data, by setting EN at a logic high level and EN/ at a logic low level, the output node 224 is pulled up to the logic high level by pull-up output transistor 220 in response to a low IN/ input signal (recall that IN/ is the complement of the data signal). If IN/ is a logic high signal, the pull-down output transistor 242 pulls down the output node 224 to the logic low level.

The circuit in FIG. 2 is optimum for output node 224 voltages equal to or lower than 2.2 volts because p-channel pull-up transistor 220 is a more efficient pull-up device at a lower $V_{D2}$ voltage. The bus driver 200 may be modified, however, for efficient operation in the voltage range between 2.2 and 3.3 volts by adding an n-channel pull-up transistor in parallel with the p-channel pull-up transistor 220.

Figure 5:
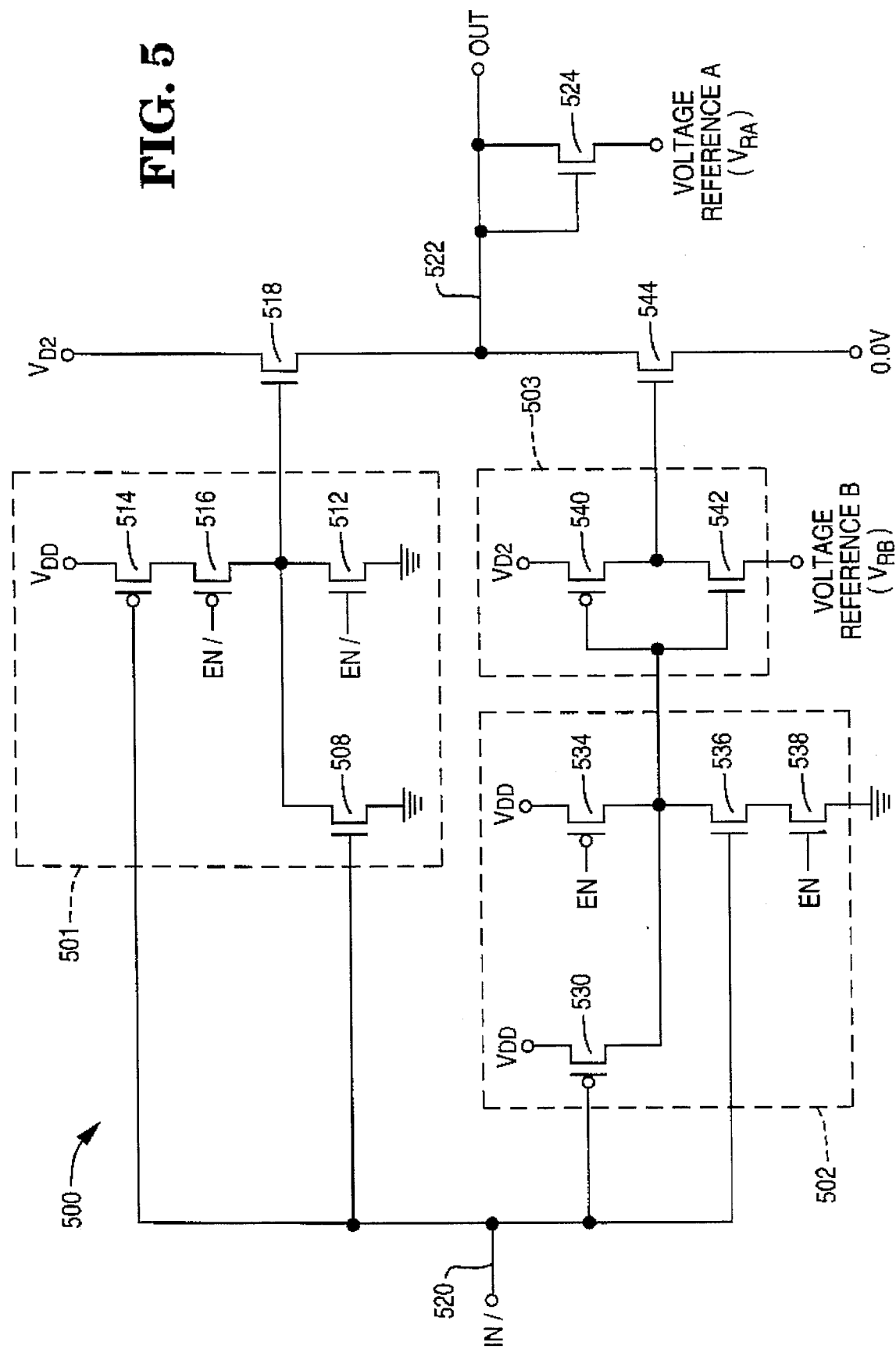
FIG. 5 is a detailed schematic diagram of an alternate embodiment of the present inventive data transfer system/ bus driver.

A bus driver circuit having a CMOS power supply voltage of 5 volts is better configured as the circuit in FIG. 5, rather than the circuit in FIG. 2. The reason for this is that the output transistor 220 in FIG. 2 would develop body effect to the extent that the transistors threshold would be too high to ever allow conduction in normal operations. The bus driver circuit 500 in FIG. 5 modifies the bus driver circuit 200 in FIG. 2 to overcome this problem. The bus driver 500 in FIG. 5 functions the same as the bus driver 200 in FIG. 2 with respect to the clamping of undershoot voltages. However, the circuit composition and function are different with respect to the clamping of overshoot voltages.

In FIG. 5 transistors 508, 514, 516 and 512 operate as a NOR gate 501 whose output is provided to an output transistor 518. Transistors 530, 534, 536 and 538 operate as a NAND gate 502 whose output is provided to an inverter 503 formed by a pair of transistors 540 and 542. The output of the inverter drives an output transistor 544. Similarly to the circuit in FIG. 2, the output transistor 544 also serves as an undershoot clamping diode when the output voltage on line 522 falls below the threshold for transistor 544. The drain of the output transistor 544 is connected to a voltage source of 0.0 volts rather than to $V_{D1}$.

An overshoot transistor 524 clamps output voltages which exceed the transistor's conduction threshold voltage. Diode operation of the transistor 524 is insured by tying its drain to its gate. $V_{RA}$ for the bus driver circuit 500 is given by the following equation:

$$V_{RA} = V_{D2} - V_{TH524} + 100 \text{ millivolts} \qquad \text{EQN3}$$

where $V_{D2}$ is the power supply voltage connected to the drain of the output transistor 518, and $V_{TH524}$ is the threshold voltage of the output transistor 524.

When the output voltage on output line 522 exceeds $V_{D2}$+100 millivolts the transistor 524 conducts to transfer excess energy from the output to the power supply $V_{RA}$ until the output voltage is pulled back down to $V_{D2}$+100 millivolts.

Although the transistor 524 increases the capacitance at the output line 522, it may be significantly smaller than the transistor 518, and yet still provide overshoot clamping. In the preferred embodiment, $V_{RA}$ is generated by the same application specific integrated circuit (ASIC) chip which subsumes the bus driver circuit. The particulars of the implementation may require, however, use of an external capacitor to handle the amount of clamping current induced.

Variations and modifications to the present invention are possible given the above disclosure. However, such variations and modifications are intended to be within the scope of the invention claimed by this letters patent. Such variations include, inter alia, an inverting data bus driver, circuit variations using P-channel transistors, a different number of clamping transistors, transistor-transistor logic (TTL) compatible drivers, and drivers using gallium arsenide transistors. Also, the undershoot and overshoot voltages may assume values other than those disclosed.

Although the presently preferred embodiment of the invention has been described, it will be understood that various changes may be made within the scope of the appended claims.

What is claimed is:

1. A high speed digital computer data transfer system comprising:

an input node (222) for receiving an input signal (IN/) having first and second input voltage levels and an output node (224) for providing an output signal (OUT) having first and second output voltage levels ($V_{D1}$ and $V_{D2}$, respectively);

first (203, 204) and second (201, 202) output drivers, each driver being connected to said input node to receive said input signal (IN/), said first and second drivers each receiving an enable signal (EN, EN/);

said first output driver for generating an output equivalent to said second output voltage level ($V_{D2}$) when said input signal (IN/) has a first input voltage level and said enable signal (EN) has a first enable voltage level, and equivalent to a first reference voltage ($V_{RB}$) when said input signal (IN/) has a second input voltage level, and equivalent to said first reference voltage ($V_{RB}$) when said enable signal (EN) has a second enable voltage level;

said second output driver for generating an output equivalent to a second reference voltage ($V_{RA}$) when said input signal (IN/) has said first input voltage level, equivalent to said second reference voltage ($V_{RA}$) when said enable signal (EN) has a second enable voltage level, and equivalent to a ground reference voltage when said input signal (IN/) has said second input voltage level and said enable signal (EN) has a first enable voltage level;

a first clamping diode transistor (242) coupled to said output node and coupled at its gate to receive the output of said first driver which activates to increase the voltage at said output node up to said first output voltage level ($V_{D1}$) representing a first logic level when said first reference voltage ($V_{RB}$) is received at its gate and the voltage at said output node falls below said first output voltage level, said first clamping diode transistor having a first threshold voltage ($V_{TH242}$); and a second clamping diode transistor (220) coupled to said output node and coupled at its gate to receive the output of said second driver which activates to lower the voltage at said output node down to said second, output voltage level ($V_{D2}$) representing a second logic level when said second reference voltage ($V_{RA}$) is received at its gate and the voltage at said output node rises above said second output voltage level, said second clamping diode transistor having a second threshold voltage ($V_{TH220}$); and wherein said first ($V_{RB}$) and second ($V_{RA}$) reference voltages are chosen to place said first and second clamping diode transistors in near-conduction states;

said first reference voltage ($V_{RB}$) being chosen to be slightly less than the sum of said first output voltage level and said first threshold voltage ($V_{D1}+V_{TH242}$);

said second reference voltage ($V_{RA}$) being chosen to be slightly greater than the difference of said second output voltage level less said second threshold voltage ($V_{D2}-V_{TH220}$).

2. The data transfer system in claim 1, wherein:

system logic low and logic high signals are defined by third and fourth voltage level signals, respectively, the range between said third and fourth voltage levels being larger than the range between said first and second voltage levels, and said first and second voltage levels lying within the range between said third and fourth voltage levels.

3. The data transfer system in claim 2, wherein:

said output node is connected to a data transfer bus, said data transfer system operating to transmit data comprising said first and second logic levels received at said input node to said data transfer bus; and said clamping diode transistors function both when said data transfer system is transmitting data and when said data transfer system is not transmitting data.

4. The data transfer system in claim 1, wherein:

said output node is connected to a data transfer bus, said data transfer system operating to transmit data comprising said first and second logic levels received at said input node to said data transfer bus; and said clamping diode transistors function both when said data transfer system is transmitting data and when said data transfer system is not transmitting data.

5. A high speed digital computer data transfer system for transferring data in the form of logic level signals to a data transfer bus, said data transfer system comprising:

an input node (520) for receiving an input signal (IN/) having first and second input voltage levels and an output node (522) for providing an output signal (OUT) having first and second output voltage levels (0.0 V and $V_{D2}$, respectively);

a first output driver (502, 503) connected to said input node, said first output driver for generating an output equivalent to said second output voltage level ($V_{D2}$) when said input signal (IN/) has a first input voltage level and said enable signal (EN) has a first enable voltage level, and equivalent to a first reference voltage ($V_{RB}$) when said input signal (IN/) has a second input voltage level, and equivalent to said first reference voltage ($V_{RB}$) when said enable signal (EN) has a second enable voltage level;

a first output transistor (544) of the clamping diode variety coupled to said output node and coupled at its gate to receive the output of said first driver which activates to increase the voltage on said data transfer bus up to said first output voltage level representing a first logic level when said first reference voltage ($V_{RB}$) is received at its gate and the voltage at said output node falls below said first output voltage level, said first output transistor having a first threshold voltage ($V_{TH544}$);

a second output transistor (518) coupled to said output node for outputting said second output voltage level ($V_{D2}$) representing a second logic level to said output node; and an overshoot clamping diode transistor (524), a second reference voltage ($V_{RA}$) being provided to said overshoot clamping diode transistor via its source, the gate and drain of said overshoot clamping diode transistor being coupled to said output node, said overshoot clamping diode operating to lower the voltage at said output node down to said second output voltage level when said data transfer bus rises above said second output voltage level, said overshoot clamping diode transistor having a second threshold voltage ($V_{TH524}$);

wherein said first ($V_{RB}$) and second ($V_{RA}$) reference voltages are chosen to place said first output transistor and said overshoot clamping diode transistor in near-conduction states;

said first reference voltage ($V_{RB}$) being chosen to be slightly less than said first threshold voltage ($V_{TH544}$);

said second reference voltage ($V_{RA}$) being chosen to be slightly greater than the difference of said second output voltage level less said second threshold voltage ($V_{D2}-V_{TH524}$).

6. The data transfer system in claim 5, wherein:

system logic low and logic high signals are defined by third and fourth voltage level signals, the range between said third and fourth voltage levels being larger than the range between said first and second voltage levels, and said first and second voltage levels lying within the range between said third and fourth voltage levels.

7. The data transfer system in claim 6, wherein:

said output node is connected to said data transfer bus, said data transfer system operating to transmit data comprising said first and second logic levels received at said input node to said data transfer bus; and said first output transistor and said overshoot clamping diode transistor function both when said data transfer system is transmitting data and when said data transfer system is not transmitting data.

8. The data transfer system in claim 5, wherein:

said output node is connected to said data transfer bus, said data transfer system operating to transmit data comprising said first and second logic levels received at said input node to said data transfer bus; and said first output transistor and said overshoot clamping diode transistor function both when said data transfer system is transmitting data and when said data transfer system is not transmitting data.

* * * * *